(12) United States Patent
Akutsu

(10) Patent No.: US 8,193,879 B2
(45) Date of Patent: Jun. 5, 2012

(54) SEMICONDUCTOR INTEGRATED CIRCUIT DEVICE

(75) Inventor: Shigekiyo Akutsu, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 1439 days.

(21) Appl. No.: 11/711,730

(22) Filed: Feb. 28, 2007

(65) Prior Publication Data

US 2007/0286316 A1 Dec. 13, 2007

(30) Foreign Application Priority Data

Jun. 8, 2006 (JP) ................ 2006-160049

(51) Int. Cl.
*H01L 21/822* (2006.01)
*H04B 1/10* (2006.01)

(52) U.S. Cl. ....................................... 333/181; 375/346

(58) Field of Classification Search ................. 333/181; 375/346, 285
See application file for complete search history.

(56) References Cited

U.S. PATENT DOCUMENTS

2007/0061769 A1* 3/2007 Kumagai ................. 716/13

FOREIGN PATENT DOCUMENTS

| JP | 10-012825 | 1/1998 |
| JP | 2004-55874 | 2/2004 |

* cited by examiner

*Primary Examiner* — Robert Pascal
*Assistant Examiner* — Kimberly Glenn
(74) *Attorney, Agent, or Firm* — Studebaker & Brackett PC; Donald R. Studebaker

(57) ABSTRACT

At least one capacitor cell for absorbing noise on a power supply voltage and a ground potential are arranged between at least one logic cell which configures a semiconductor integrated circuit and a power supply main line for supplying a power supply voltage to the logic cell. The power supply voltage where noises are suppressed by the capacitor cells is supplied to the logic cell, thus improving performance of the semiconductor integrated circuit. In addition, a distribution density of the capacitor cell or a capacity of the capacitor cell increases as the capacitor cell is separated from the power supply main line. A predetermined power supply voltage is supply to the logic cell which is separated from the power supply main line, so that a decrease in operation speed of the semiconductor integrated circuit can be suppressed.

2 Claims, 7 Drawing Sheets

SEMICONDUCTOR INTEGRATED CIRCUIT DEVICE

BACKGROUND OF THE INVENTION

1. Field of the Invention

The present invention relates to a semiconductor integrated circuit device that can reduce dynamic noise generated in power supply lines and prevent a malfunction operation thereof.

2. Description of the Related Art

In a recent semiconductor integrated circuit device, power consumption per unit area increases accompanying an increase in integration of the device, thus causing a high noise level in the power supply therefore. Furthermore, the power supply voltage for supplying to the semiconductor integrated device decreases accompanying the miniaturization of the device, resulting in a decrease in an ability of the device to resist the power supply noise. For the purpose of eliminating these problems, decoupling capacitor cells are provided on a PCB (Printed Circuit Board) for coupling between the semiconductor integrated circuit devices (described in, for example, "Japanese Patent Kokai No. H10-12825"). Capacitor cells are also provided in unused regions of the semiconductor integrated circuit not occupied by the decoupling capacitor cells and logic cells. The decoupling capacitor cells and capacitor cells are used for suppressing the power supply noise.

A conventional semiconductor integrated circuit will now be described with reference to the accompanying drawings. FIG. 1 illustrates a plan view of a conventional semiconductor integrated circuit device 68 described in, for example, "Japanese Patent Koki No. 2004-55874". As shown in FIG. 1, a power supply voltage is supplied from an outer circumference of the semiconductor integrated circuit device 68, so that a voltage drop 70 of the power supply increases as it approaching the center of the semiconductor integrated circuit device 69. A voltage drop margin 72 with respect to a permissible voltage 71 decreases as it approaching the center of the semiconductor integrated circuit device 69. The logic cells can normally operate above the permissible voltage 71. Thus, the conventional semiconductor integrated circuit device is provided with capacitor cells, each of which has a charge storage capacity sufficient to compensate the voltage drop.

However, the following problems occur in the conventional semiconductor integrated device described above. As shown in FIG. 2, a method for designing the device includes the steps of forming the logic cells (S21), forming the capacitor cells (S22), and forming empty cells (S23). After forming the logic cells (S21), the capacitor cells are formed on the semiconductor integrated circuit device (step S22). The capacitor cells are formed in spaces between the logic cells. Thus, the capacitor cells are densely distributed in regions where the logic cells are thinly distributed, whereas the capacitor cells are thinly distributed in regions where the logic cells are densely distributed. FIG. 3 illustrates a plan view of a conventional semiconductor device which is designed by using the method shown in FIG. 2. A sufficient number of capacitor cells are not disposed adjacent to regions 67 where logic cells 66 are densely disposed. The logic cells generate noise which is superimposed on the power supply voltage, so that the noise is transmitted through power supply lines 61 and ground lines 62. FIG. 4 is a schematic circuit diagram of a part of the semiconductor integrated circuit of FIG. 3. As shown in FIG. 4, the logic cells 66 are substantially separated from the capacitor cells 65. The power supply noise generated by the logic cells 66 are transmitted a long distance to the capacitor cells 65, so that parasitic resistances of the power supply lines 61 and ground lines 62 increases. As a result, there arises a problem that the decoupling effect of the capacitor cells decreases and thus the power supply noise is not effectively reduced.

The capacitor cells are provided in spaces not occupied by the logic cells. An area of the capacitor cell is adjusted to that of the spaces. In the case where the space has a small area, capacitor per area of the capacitor cell can not be increased. Therefore, in the case where the spaces between the logic cells are small in area, capacitor cells that have small capacities cannot be provided in the spaces. Thus, efficient decoupling capacities can not be obtained in the semiconductor integrated device and thus the power supply noise is not effectively reduced.

In addition, in the case where the capacitor cells are provided locally in the center of the semiconductor integrated circuit device from the view of voltage drops in the power supply lines of the center of the device, the power supply noise of the semiconductor integrated device can not be decreased sufficiently. Moreover, in the case where the logic cells are formed prior to the capacitor cells, the semiconductor integrated circuit is so configured that the logic cells are locally distributed in the center of the device. Unnecessary delays occur in the integrated circuit, thus decreasing operation speed of the integrated circuit.

SUMMARY OF THE INVENTION

It is an object of the present invention to suppress noise on a power supply voltage supplied to a semiconductor integrated circuit more effectively. Another object of the present invention is that a decrease in operation speed of an integrate circuit can be prevented, even if logic cells are mainly provided in the center of the integrated circuit.

According to an aspect of the present invention, there is provided a semiconductor integrated circuit device comprising a power supply main line for supplying a power supply voltage, a plurality of power supply lines connected to the power supply main line, at least one capacitor cell provided between the power supply lines, and at least one logic cell provided between the power supply lines, the logic cell configuring a semiconductor integrated circuit. The capacitor cell is placed between the power supply main line and the logic cell. A distribution density of the capacitor cell increases as said capacitor cell is separated from said power supply main line.

The semiconductor integrated circuit device according to the present invention has a decoupling effect to reduce power supply noise. The device also has an effect that the noise in the power supply can be suppressed more effectively. The device can suppress the power supply noise of the entire semiconductor integrated circuit device more effectively. A decrease in operation speed of the semiconductor integrated circuit device can be suppressed even if logic cells are densely provided in the center thereof.

DETAILED DESCRIPTION OF THE INVENTION

An embodiment of the present invention will be now described with reference to the drawings.

Figure 1:
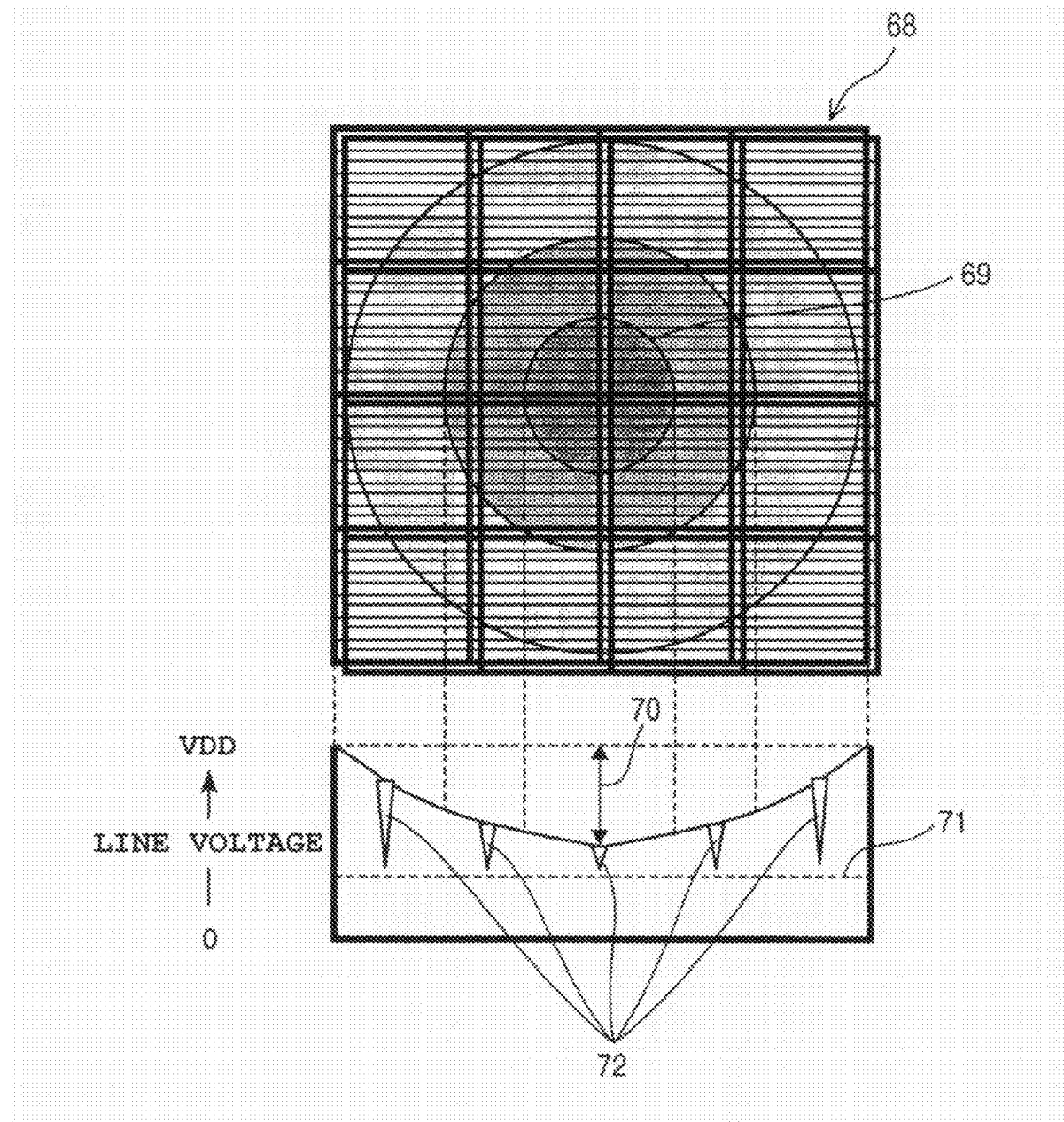
FIG. 1 is an explanatory diagram of voltage drops of the conventional semiconductor integrated circuit device.
Figure 2:
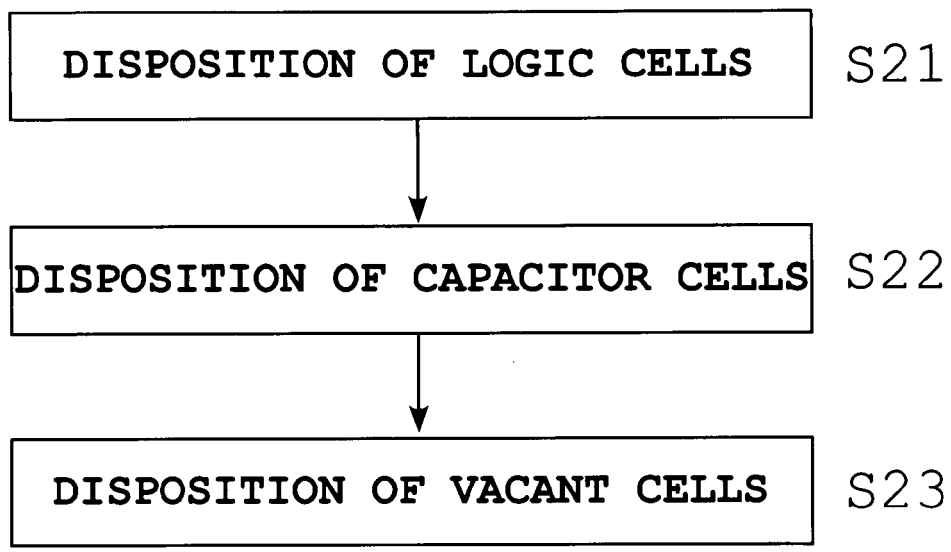
FIG. 2 is a flow chart showing a conventional method for disposing capacitor cells.
Figure 3:
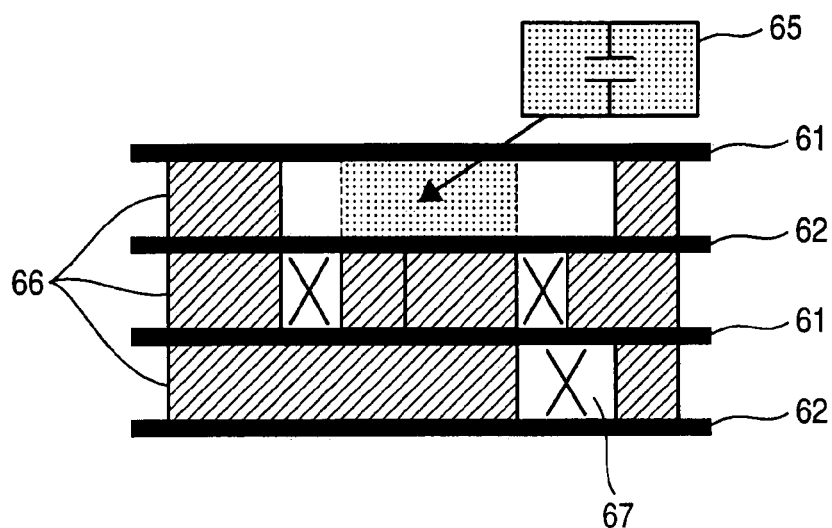
FIG. 3 is a schematic diagram showing a conventional semiconductor integrated circuit device.
Figure 4:
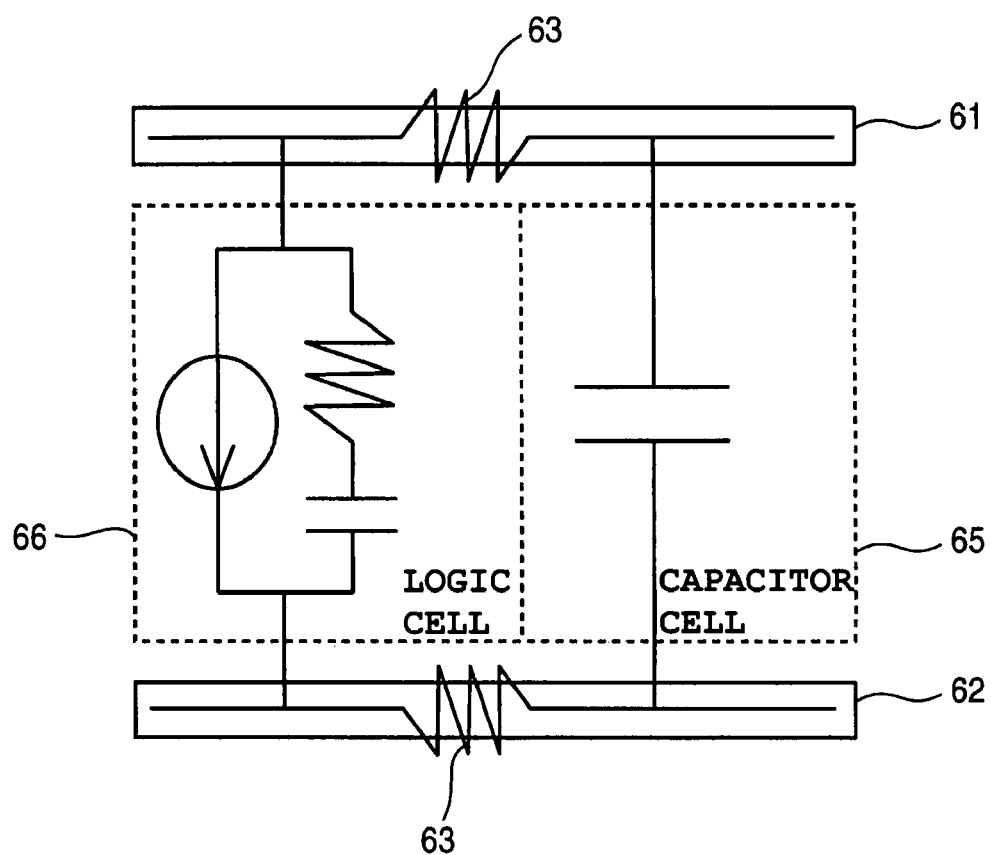
FIG. 4 is a schematic circuit diagram showing a part of the conventional semiconductor integrated circuit device.
Figure 5:
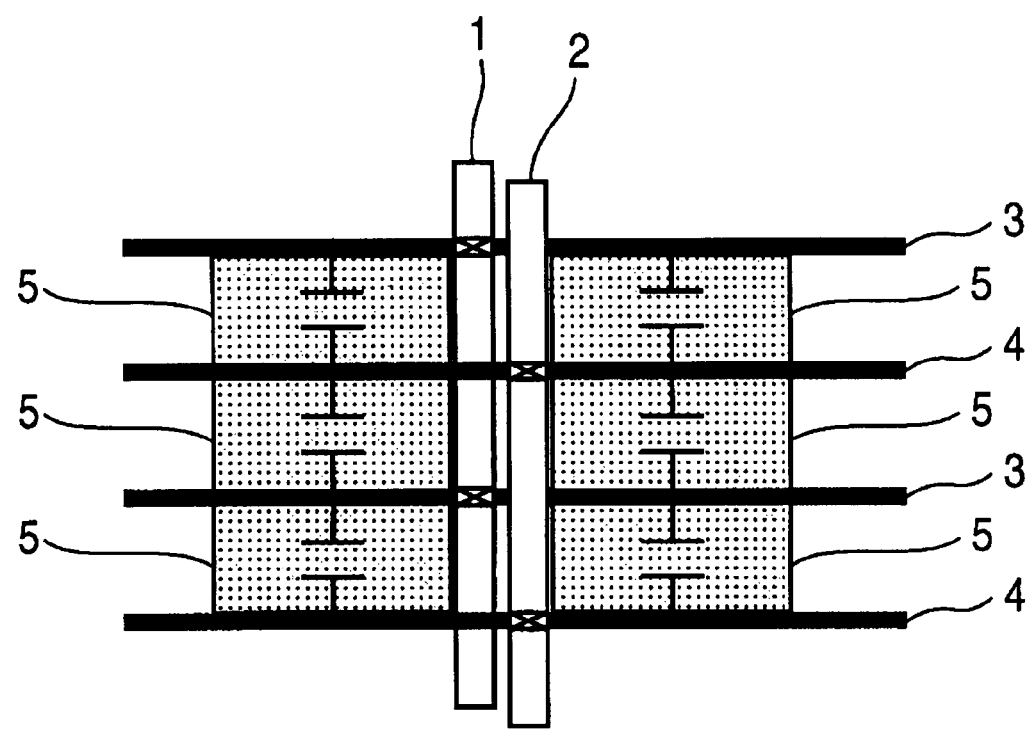
FIG. 5 is an explanatory diagram of a semiconductor integrated circuit device where capacitor cells are disposed, which device is an embodiment of the present invention.

FIG. 5 is a plan view showing a semiconductor integrated circuit device of the embodiment with capacitor cells arranged thereon. The semiconductor integrated circuit device includes a power supply main line 1, a ground main line 2, power supply lines 3, and ground lines 4. The power supply lines 3 are connected to the power supply main line 1. The ground lines 4 are connected to the ground main lines 2. The semiconductor integrated circuit device also includes capacitor cells 5 which are arranged adjacent to the power supply main line 1 and the ground main line 2. The capacitor cells 5, each of which has a capacity in which the capacity per unit area is larger than one, are disposed close to the power supply main line 1 and the ground main line 2. The semiconductor integrated circuit device further includes logic cells (not shown in FIG. 5) which configure a semiconductor integrated circuit. The capacitor cells 5 are formed prior to the logic cells. Then, the logic cells are provided on regions not occupied by the capacitor cells 5.

It is to be noted that one logic cell corresponds to a region where one inverter element including one PMOS and NMOS transistors is formed. Distances between the capacitor cells 5 and the power supply main line 1 is shorter than distances between the logic cells and the power supply main line 1. Distances between the capacitor cells 5 and the ground main line 2 is also shorter than distances between the logic cells and the ground main line 2. The capacitor cells 5 are electrically connected to the power supply lines 3 and the ground lines 4, so that effective decoupling capacities can be achieved in the semiconductor integrated circuit device.

In the direction in which the power supply main line 1 and the ground main line 2 extend, the lengths of the capacitor cells and the logic cells may be substantially the same with each other.

Figure 6:
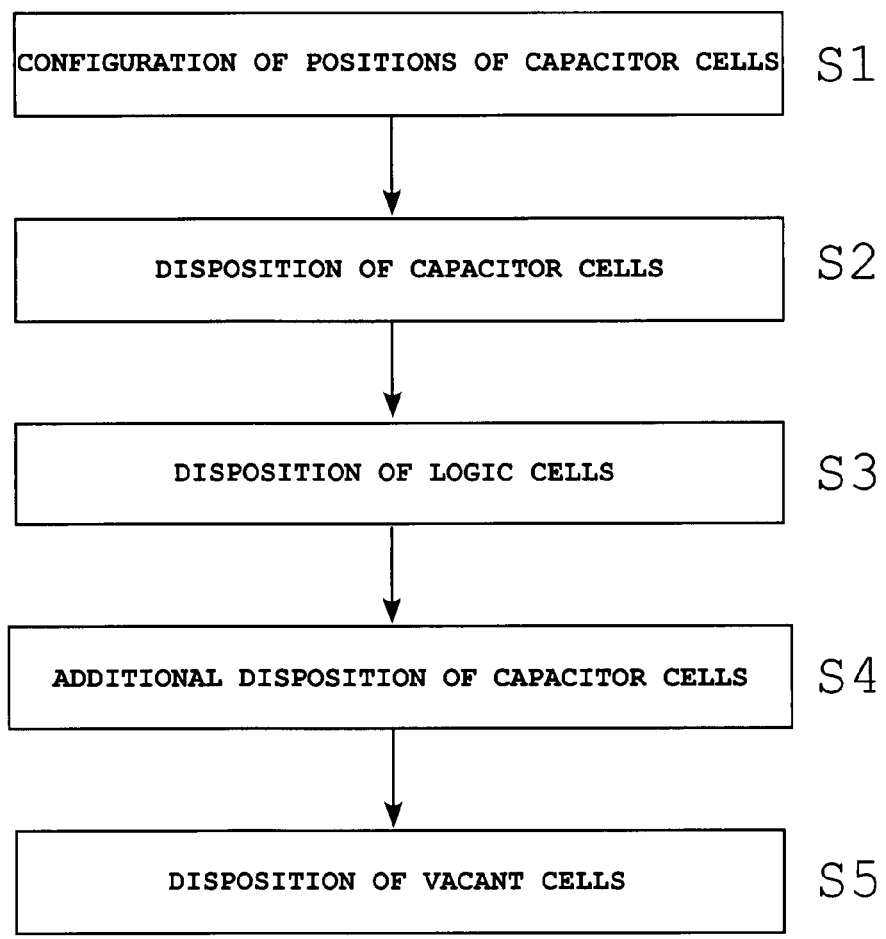
FIG. 6 is a flow chart showing a procedure of disposing the capacitor cells of the semiconductor integrated circuit device.
Figure 7:
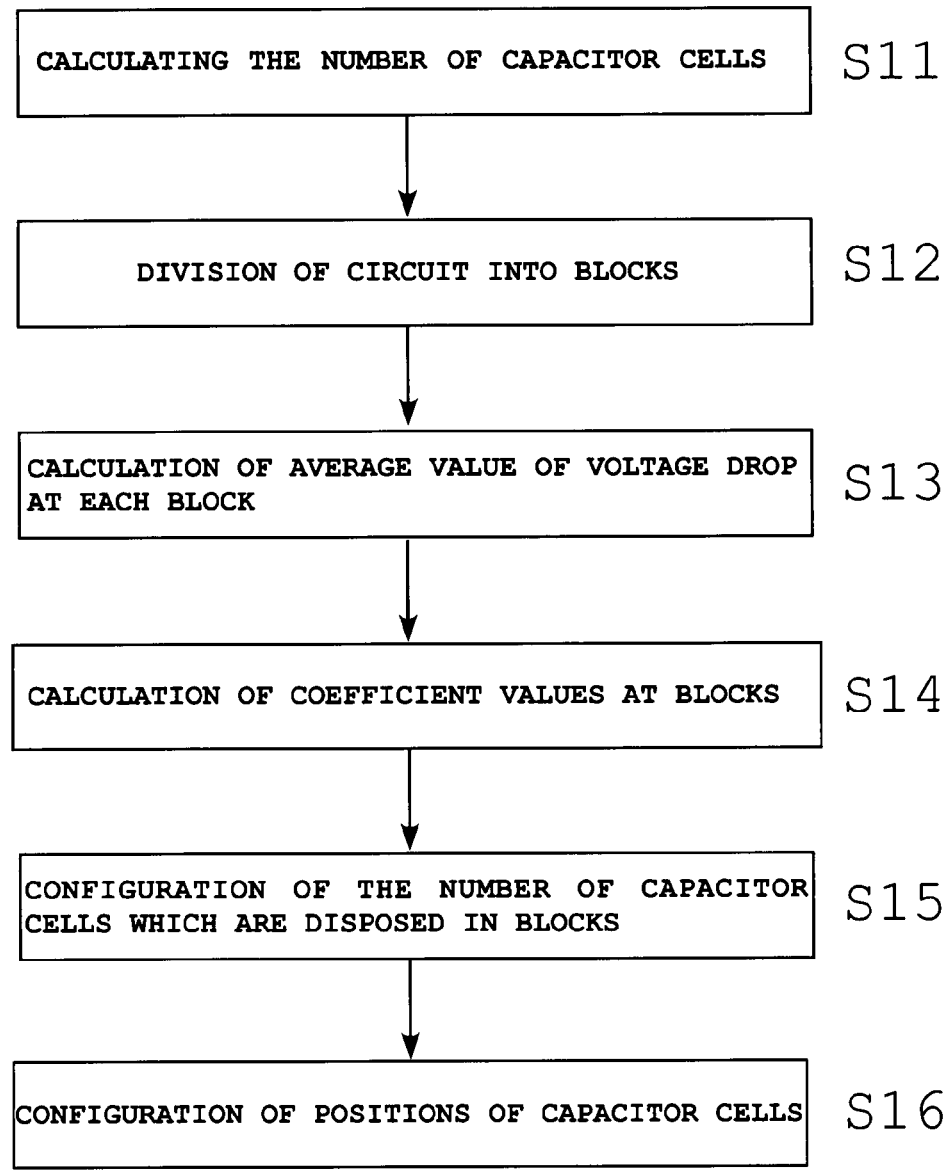
FIG. 7 is a flow chart showing a procedure of determining the positions of the capacitor cells of the semiconductor integrated circuit device.

A procedure for forming the capacitor cells 5 will now be described with reference to the following drawings. FIG. 6 is a flow chart showing a procedure for forming the capacitor cells. FIG. 7 is a flow chart showing a procedure for determining positions of the capacitor cells.

First of all, the procedure for forming the capacitor cells will be described with reference to FIG. 6.

S1: The number and positions of the capacitor cells placed on the semiconductor integrated circuit device are determined. This step will be described later in detail.

S2: After the number and positions of the capacitor cells placed on the semiconductor integrated circuit device are determined, the capacitor cells are formed on the semiconductor integrated circuit device and electrically connected to the power supply lines and the ground lines.

S3: After forming the capacitor cells, logic cells are formed on the semiconductor integrated circuit device and connected to the power supply lines and the ground lines. In the step S3, the positions of the logic cells are determined so that the capacitor cells, both of which are placed in the step S2, are not transferred as much as possible.

S4: After forming the logic cells, additional capacitor cells are placed in spaces in the semiconductor integrated circuit device where the capacitor cells and the logic cells are not formed in the steps S2 and S3.

S5: After forming the additional capacitor cells, empty cells are formed in small spaces of the device. Then, the dispositions of capacitor cells and logic cells are completed.

Next, a procedure for forming capacitor cells will be described with reference to FIG. 7. The step S21 includes the following steps S11 to S26.

S11: An area necessary for forming the logic cells is calculated on the basis of gate scale of the semiconductor integrated circuit device. An area necessary for forming the capacitor cells is calculated by subtracting the area of the logic cells from the area of the semiconductor integrated circuit device. The occupied area of the capacitor cells is divided by the area occupied one capacitor cell. Thus, the number of the capacitor cells is calculated.

Moreover, the number of power supply lines is calculated on the basis of the gate scale of the semiconductor integrated circuit device. The power supply lines are formed and then the voltage drop of the power supply lines is estimated.

Figures 8, 9:
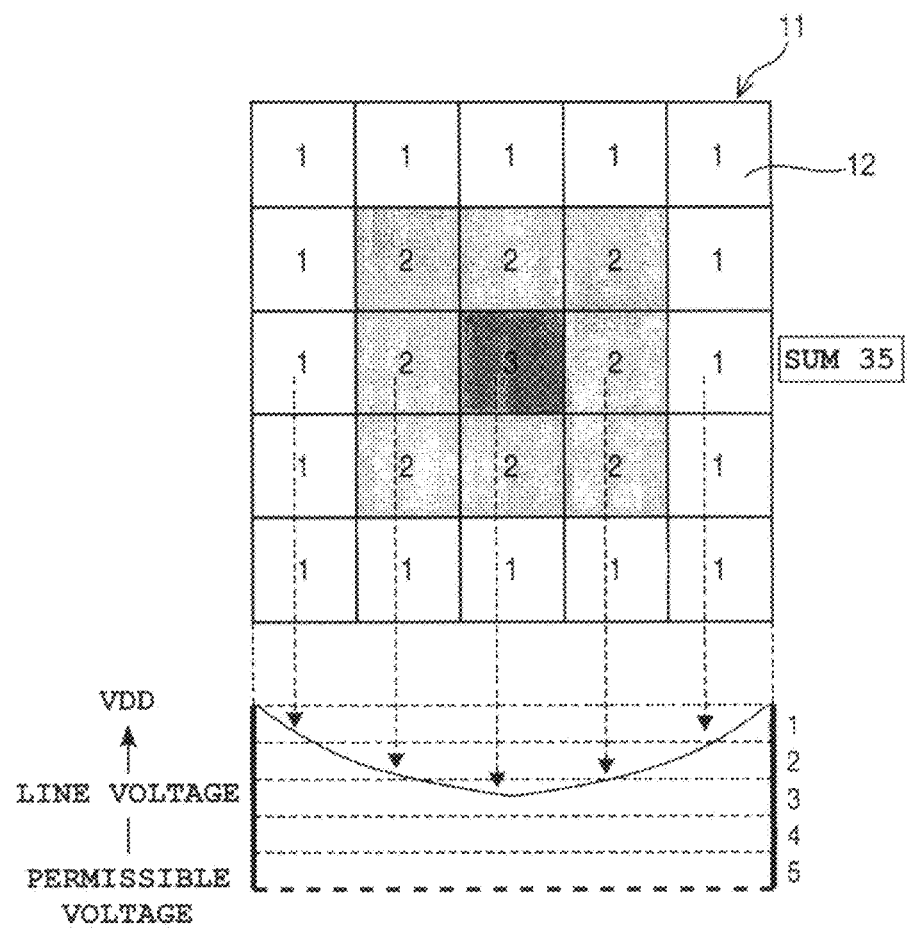
FIG. 8 is an explanatory drawing showing the semiconductor integrated circuit device divided into blocks.
FIG. 9 is an explanatory drawing showing capacitor area ratios of the capacitor cell of the semiconductor integrated circuit device.

A capacitance value of the capacitor cell will now be described with reference to FIG. 9. When a capacitance value of the capacitor cell having on area (size) of "x1" is assumed to be 1, a capacitance value of the capacitor cell having on area (size) of "x2", corresponds to 5. A capacitance value of the capacitor cell having on area (size) of "x4", corresponds to 7. A capacitance value of the capacitor cell having on area (size) of "x8", corresponds to 7. A capacitance value of the capacitor cell having on area (size) of "x16", corresponds to 8.

A polycrystalline silicon film which corresponds to one of the electrodes is formed on the insulation film on a substrate. A power supply wiring line (a VDD wiring line) and an installation wiring line (a VSS wiring line), both of which are on the insulation film, are respectively connected to the substrate and the polycrystalline silicon film via a contact hole. The capacitor cells are so configured that they are placed on regions where contact holes are connected to the VDD wiring line and the VSS wiring line are provided. As the capacitor cells increasing in area, an occupied area of the capacitor cells, in which the contact holes connected to the VDD wiring line and the VSS wiring line are provided, decreases, thus increasing capacity per unit area of the capacitor cell. According to the present invention, the capacitor cells, each of which has a capacitor per unit area larger than one, are placed near the power supply main line and the ground main line.

As area of the capacitor cell increases, the capacitance value of the capacitor cell increases. The area of the insulating layer formed in the capacitor cell can be enlarged and thus the capacitance value of the capacitor cell can be increased. In the case where the capacitor cell has a large area, a contact hole is required to be provided between the VDD wiring line and the VSS wiring line. Since the area of the insulating layer is not proportional to the area of the capacitor cell, the capacitance value of the capacitor cell does not necessarily increase in proportion to the area thereof.

S12: After calculating the number of the capacitor cells, the semiconductor integrated circuit device is divided into a plurality of blocks. FIG. 8A is a plan view of a semiconductor integrated device where a power supply main line surrounds the semiconductor integrated device. As shown in FIG. 8A, a semiconductor integrated circuit formation area 11, which configures the one semiconductor integrated circuit device, is divided into twenty-five blocks 12. The semiconductor integrated circuit formation area 11 is vertically divided into five and horizontally divided into five.

S13: After dividing the semiconductor integrated circuit formation area 11 into a plurality of blocks 12, each average value of voltage drops at the blocks 12 is calculated on the basis of the voltage drops of the power supply lines which are estimated in the step S11.

S14: After calculating the average values of voltage drops in the blocks 12, the average values are converted into coefficient values which are normalize by the magnitude of the voltage drops at the blocks 12. FIG. 8B is a graph showing the magnitude of the voltage drops at the blocks 12. As show in FIG. 8B, a voltage between a voltage (VDD) at the power supply line and a permissible voltage is sliced into five levels. The logic cells in the semiconductor integrated circuit device are operable above the permissible voltage. Voltage at the five blocks 12 placed on the third line of FIG. 8A (denoted by dot lines) decreases as it approaching the center of the semiconductor integrated circuit formation area 11. Estimated coefficient values of these blocks 12 is 1, 2, 3, 2, 1 in sequence from the left end of the blocks 12.

As described above, the coefficient values of all blocks 12 are calculated and then the sum of all coefficient values of the blocks 12 is calculated. The sum of all coefficient values is shown in FIG. 8A is 35.

S:15 After calculating the sum of all the coefficient values, the number of the capacitor cells which are disposed in each block 12 (Nc) is calculated by an expression given by Nc×Cv÷C where Nc is the number of the capacitor cells obtained in the step S11, Cv represents coefficient values of each block, and C is the total coefficient value. That is, the number of the capacitor cells is calculated on the basis of the magnitude of the voltage drop at the power supply line which is placed on the block.

Thus, the capacitor cells are densely distributed in the block 12 where voltage drop is relatively large, whereas the capacitor cells are thinly distributed in the block 12 where voltage drop is relatively small. The capacitor cells are positioned based on the overall voltage drops of the semiconductor integrated circuit device.

S:16 After calculating the number of the capacitor cells disposed in each block 12, the capacitor cells are disposed prior to the logic cells. The capacitor cells are disposed adjacent to the power supply main line.

As described above, the capacitor cells are provided prior to forming the logic cells. The capacitor cells with large capacity per unit area are located close to the power supply main line. The capacitor cells are disposed on the regions where voltage drops of the power supply lines are large prior to forming the logic blocks.

The present invention is adapted to the semiconductor integrated circuit device including the capacitor cells for compensating the voltage drop at the power supply lines and for suppressing the power supply noise generated in the power supply main lines and ground main lines. The present invention can also be adapted to other semiconductor integrated circuit device further including another capacitor cells for reducing voltage increases at ground lines.

The present invention is described as a semiconductor integrated circuit device where the capacitor cells are formed prior to the logic cells. The logic cells may be formed prior to the capacitor cells. In this case, the logic cells formed adjacent to the power supply main line are removed, and then the capacitor cells are formed. The removed logic cells are rearranged.

According to the embodiment, the values of the voltage drop at the power supply lines are calculated after forming the power supply lines and the coefficient values of blocks are calculated. Values of the voltage drops may be calculated after disposing and wiring the capacitor cells and the logic cells. The coefficient values of blocks are calculated on the basis of the values of the voltage drops and thus the number of the capacitor cells is determined.

According to the semiconductor integrate device of the embodiment, the capacitor cells with a large capacity per unit area are arranged. The capacitor cells are arranged adjacent to the power supply main line. Both capacitor cells are provided prior to the logic cells. Thus, the semiconductor integrated circuit device has a decoupling effect sufficient for effectively suppressing power supply noise.

The capacitor cells are arranged on the basis of the overall voltage drop of the power supply lines, so that the capacitor cells are densely distributed as they are separated from the power supply main line. Malfunctions occurring in the logic cells due to the voltage drops can be effectively suppress. A decrease in the operation speed of the semiconductor integrated circuit device can be prevented even if the logic cells are densely arranged in the center of the device.

This application is based on Japanese Patent Application No. 2006-160049 which is herein incorporated by reference.

What is claimed is:

1. A semiconductor integrated circuit device comprising:
   a power supply main line for supplying a power supply voltage;
   a plurality of power supply lines connected to said power supply main line;
   at least one capacitor cell disposed between said power supply lines;
   at least one logic cell disposed between said power supply lines, said logic cell configuring a semiconductor integrated circuit,
   wherein
   said capacitor cell is placed between said power supply main line and said logic Cell; and
   a ground main line connected to a ground potential, said ground main line being substantially parallel to said power supply main line; and
   a plurality of ground lines connected to said ground main line, said ground lines being substantially parallel to said power supply lines;
   wherein
   said capacitor cell is placed between said ground main line and said logic cell, and
   wherein
   a distribution density of said capacitor cell increases as said capacitor cell is separated from said power supply main line.

2. A semiconductor integrated circuit device comprising:
   a power supply main line for supplying a power supply voltage;
   a plurality of power supply lines connected to said power supply main line;
   at least one capacitor cell disposed between said power supply lines;
   at least one logic cell disposed between said power supply lines, said logic cell configuring a semiconductor integrated circuit, wherein
said capacitor cell is placed between said power supply main line and said logic cell; and
a ground main line connected to a ground potential, said ground main line being substantially parallel to said power supply main line; and
a plurality of ground lines connected to said ground main line, said ground lines being substantially parallel to said power supply lines;

wherein
said capacitor cell is placed between said ground main line and said logic cell, and
wherein
a capacity of said capacitor cell increases as said capacitor cell is separated from said power supply main line.

\* \* \* \* \*